United States Patent
Miura et al.

(10) Patent No.: US 10,897,809 B2
(45) Date of Patent: Jan. 19, 2021

(54) PRINTED CIRCUIT BOARD, AIR CONDITIONER, AND METHOD FOR MANUFACTURING PRINTED CIRCUIT BOARD

(71) Applicant: Mitsubishi Electric Corporation, Tokyo (JP)

(72) Inventors: Tsuyoshi Miura, Tokyo (JP); Masahiro Koyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/337,610

(22) PCT Filed: Dec. 16, 2016

(86) PCT No.: PCT/JP2016/087509
§ 371 (c)(1),
(2) Date: Mar. 28, 2019

(87) PCT Pub. No.: WO2018/109919
PCT Pub. Date: Jun. 21, 2018

(65) Prior Publication Data
US 2020/0084874 A1    Mar. 12, 2020

(51) Int. Cl.
*H05K 1/02*  (2006.01)
*H05K 3/32*  (2006.01)
*H05K 3/34*  (2006.01)

(52) U.S. Cl.
CPC ............. *H05K 1/021* (2013.01); *H05K 3/321* (2013.01); *H05K 3/3421* (2013.01); *H05K 3/3494* (2013.01); *H05K 2201/10984* (2013.01)

(58) Field of Classification Search
CPC ....... H05K 1/0203; H05K 3/366; H05K 1/021
See application file for complete search history.

(56) References Cited

U.S. PATENT DOCUMENTS

2001/0026441 A1   10/2001  Nakamura
2004/0170000 A1*  9/2004   Fujiwara ................ G06F 1/203
                                                      361/719
(Continued)

FOREIGN PATENT DOCUMENTS

CN       1725930 A      1/2006
JP     S58-164267 U    11/1983
(Continued)

OTHER PUBLICATIONS

Office Action dated Sep. 6, 2019 issued in corresponding EP patent application No. 16905695.9.
(Continued)

*Primary Examiner* — Jeremy C Norris
(74) *Attorney, Agent, or Firm* — Posz Law Group, PLC

(57) ABSTRACT

To achieve heat dissipation of a wiring pattern inexpensively with a simple configuration, a printed circuit board includes an insulating substrate having a plurality of wiring patterns on a main surface thereof, and an electronic component mounted on the main surface and connected to the wiring patterns. Further, the printed circuit board includes a heat-dissipating surface mount component that is a surface mount component. The heat-dissipating surface mount component is joined via a solder to each of the wiring patterns on the main surface to dissipate heat of the wiring pattern.

8 Claims, 7 Drawing Sheets

(56) References Cited

U.S. PATENT DOCUMENTS

| | | | |
|---|---|---|---|
| 2006/0033185 A1* | 2/2006 | Kummerl | H01L 23/3107 257/666 |
| 2008/0112139 A1 | 5/2008 | Vinciarelli et al. | |
| 2011/0284271 A1 | 11/2011 | Kim | |
| 2015/0257250 A1 | 9/2015 | Jeon | |
| 2017/0273218 A1* | 9/2017 | Stoermer | H05K 7/20445 |

FOREIGN PATENT DOCUMENTS

| | | | |
|---|---|---|---|
| JP | H04-255294 A | 9/1992 | |
| JP | H05-315776 A | 11/1993 | |
| JP | 2003-188565 A | 7/2003 | |
| JP | 2004-253635 A | 9/2004 | |
| JP | 2010-225713 A | 10/2010 | |
| JP | 2013-161812 A | 8/2013 | |
| JP | 2014-179523 A | 9/2014 | |

OTHER PUBLICATIONS

International Search Report of the International Searching Authority dated Mar. 7, 2017 for the corresponding international application No. PCT/JP2016/087509 (and English translation).

Extended European Search Report dated Nov. 26, 2018 issued in corresponding EP patent application No. 16905695.9.

Japanese Office Action dated Jan. 14, 2020 issued in corresponding JP patent application No. 2018-556138 (with English translation).

Summons to attend oral proceedings pursuant to Rule 115(1) EPC mailed Mar. 31, 2020 in corresponding EP patent application No. 16 905 695.9.

Office Action dated Sep. 23, 2020 issued in corresponding JP patent application No. 2018-556138 (and English translation).

Office Action dated Sep. 23, 2020 issued in corresponding EP patent application No. 16905695.9.

Provision of the minutes in accordance with Rule 124(4) EPC dated Oct. 19, 2020 from the European patent office in corresponding EP patent application No. 16905695.9.

Decision to refuse a European Patent dated Oct. 20, 2020 from the European patent office in corresponding EP patent application No. 16905695.9.

Anonymous, "PCB Design for Manufacturability | Altron", Nov. 6, 2016 (Nov. 6, 2016), XP05537597, Retrieved from the Internet: URL:https://web.archive/web.archive/web/20161106060712/https://www.altronmfg.com/pcb-design-for-manufacturability/ [retrieved on Oct. 7, 2020]cited in Decision to refuse a European Patent dated Oct. 20, 2020.

* cited by examiner

PRINTED CIRCUIT BOARD, AIR CONDITIONER, AND METHOD FOR MANUFACTURING PRINTED CIRCUIT BOARD

CROSS REFERENCE TO RELATED APPLICATION

This application is a U.S. national stage application of International Patent Application No. PCT/JP2016/087509 filed on Dec. 16, 2016, the disclosure of which is incorporated herein by reference.

TECHNICAL FIELD

The present invention relates to a printed circuit board on which a surface mount component for heat dissipation is mounted, an air conditioner that uses this printed circuit board, and a method for manufacturing the printed circuit board.

BACKGROUND

In a printed circuit board, a wiring pattern arranged on an insulating substrate generates heat when a current flows through the wiring pattern. Also, when a current flows through an electronic component mounted on the printed circuit board, heat generated in the electronic component is transferred to the wiring pattern. Therefore, the wiring pattern is excessively heated and hence damaged, or transferred heat hinders cooling of other electronic components mounted on the wiring pattern.

In order to reduce heating of the wiring pattern, Patent Literature 1 discloses mounting a heat-dissipating component three-dimensionally directly below a heat-generating component. In Patent Literature 1, a tower-like metal component having a plurality of fins is placed on each pad arranged on a printed wiring board and is soldered thereto, and each of electrodes of a surface mount component interconnecting a pair of the tower-like metal components is soldered to a top end surface of the corresponding tower-like metal component.

Patent Literature 2 discloses a substrate unit including a substrate that has a plurality of wiring patterns, a heat-generating component mounted on at least a first main surface of the substrate, and a metal chip mounted on at least either of the first main surface and a second main surface opposite to the first main surface. The metal chip is connected to a heat sink via a heat conductive material. Further, Patent Literature 2 discloses providing a through hole in the substrate and providing a heat-dissipating unit on the opposite surface, thereby increasing a heat dissipating effect.

PATENT LITERATURES

Patent Literature 1: Japanese Patent Application Laid-open No. H5-315776
Patent Literature 2: Japanese Patent Application Laid-open No. 2014-179523

However, Patent Literature 1 described above has a problem of requiring the complicated design and complicated assembly work in order to reduce increase in temperature of the wiring pattern, and it is therefore difficult to inexpensively achieve stable and efficient heat dissipation of the wiring pattern. Further, Patent Literature 2 above does not mention a method for mounting the metal chip efficiently and inexpensively.

SUMMARY

The present invention has been achieved in view of the above problems, and an object of the present invention is to provide a printed circuit board of simple structure capable of inexpensively achieving the heat dissipation of the wiring pattern.

To solve the above problem and achieve the object, the present invention provides a printed circuit board comprising: an insulating substrate having a plurality of wiring patterns on a main surface thereof; an electronic component mounted on the main surface and connected to the wiring patterns; and a heat-dissipating surface mount component that is a surface mount component, the heat-dissipating surface mount component being joined via a solder to each of the wiring patterns on the main surface to dissipate heat of the wiring pattern.

The printed circuit board according to the present invention has an effect that the simple structure can inexpensively achieve the heat dissipation of the wiring pattern.

DETAILED DESCRIPTION

A printed circuit board, an air conditioner, and a method for manufacturing a printed circuit board according to an embodiment of the present invention will be explained in detail below with reference to the accompanying drawings. The present invention is not limited to the embodiment.

Embodiment

Figure 1:
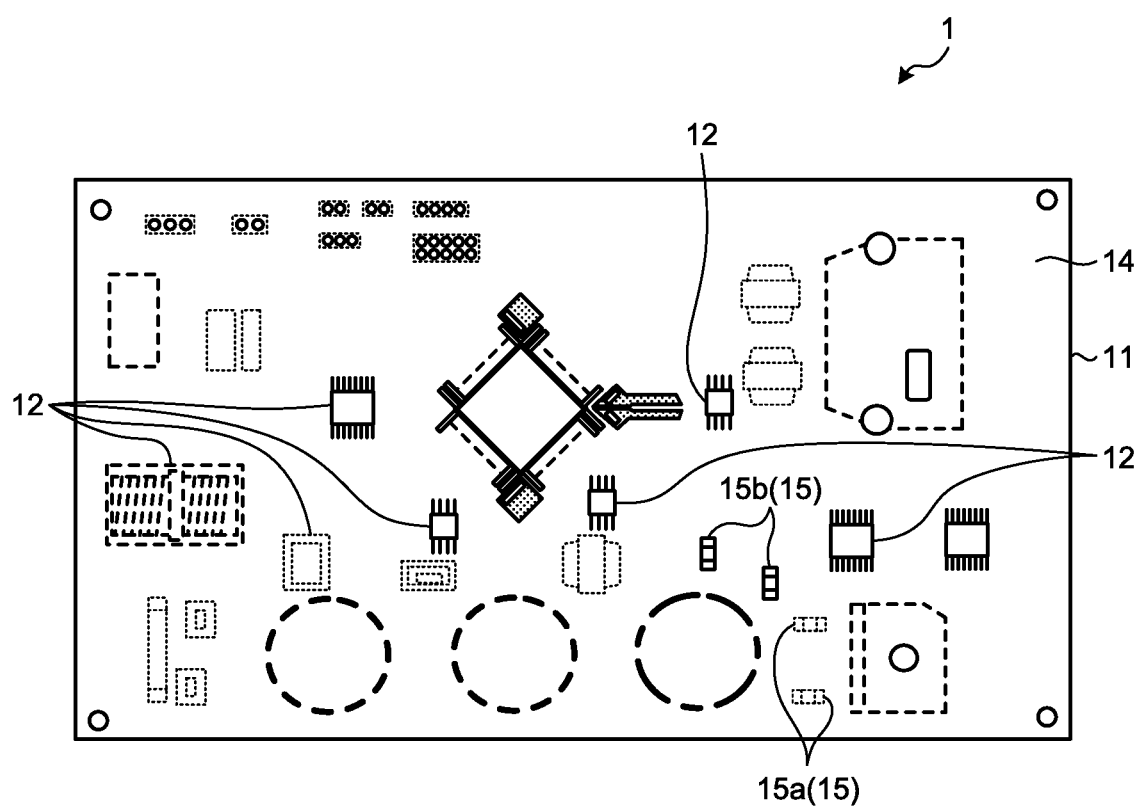
FIG. 1 is a schematic plan view illustrating an overview of configuration of a printed circuit board according to an embodiment of the present invention, as viewed from a side of a second main surface of the circuit board.
Figure 2:
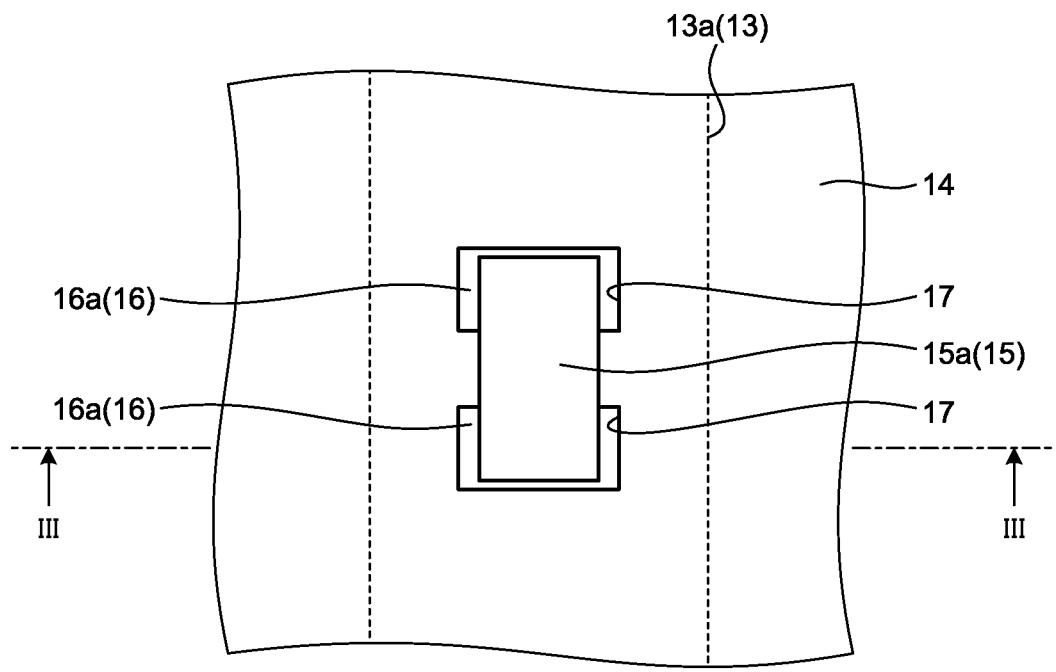
FIG. 2 is an enlarged plan view of a relevant part of a region on a side of a first main surface of the printed circuit board according to the embodiment of the present invention, where a first heat-dissipating surface mount component is mounted.
Figure 3:
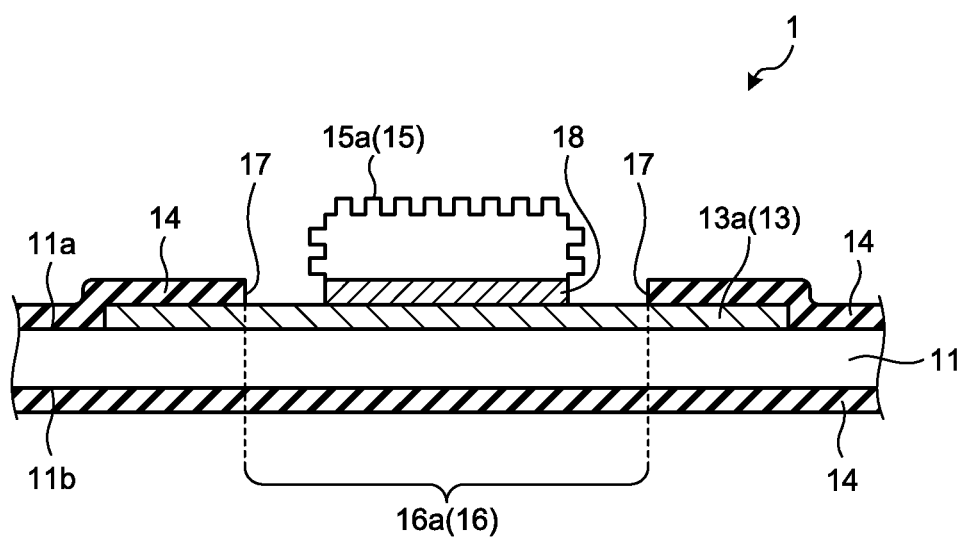
FIG. 3 is a cross-sectional view of the relevant part of a region on the printed circuit board according to the embodiment of the present invention, where the first heat-dissipating surface mount component is mounted.
Figure 4:
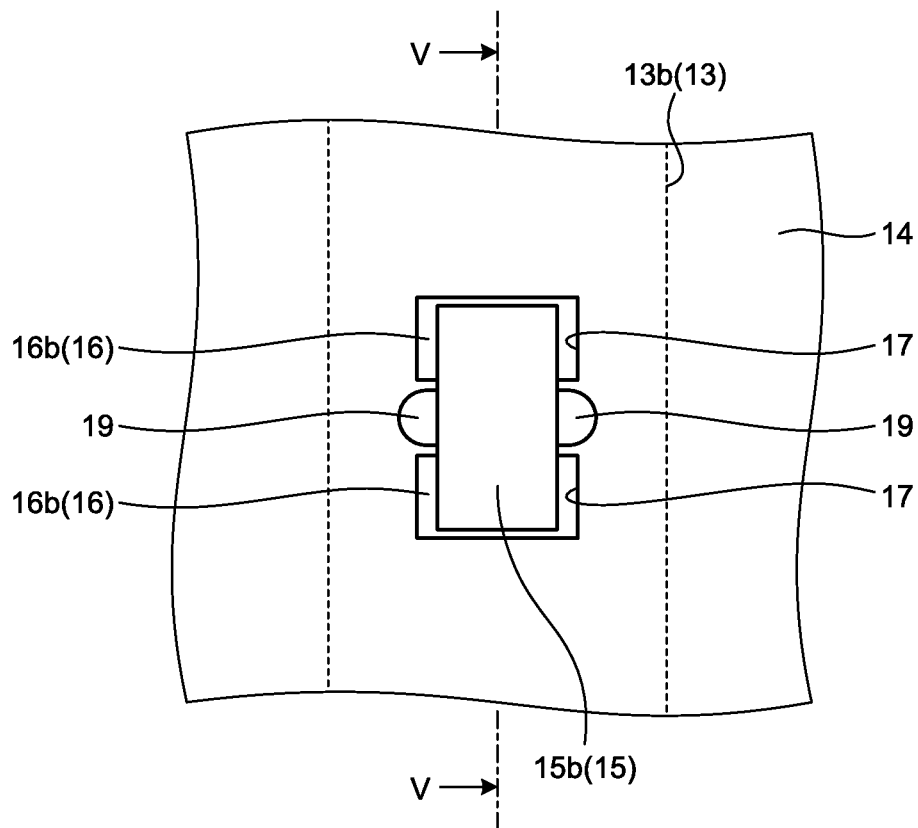
FIG. 4 is an enlarged plan view of a relevant part of a region on a side of the second main surface of the printed circuit board according to the embodiment of the present invention, where a second heat-dissipating surface mount component is mounted.
Figure 5:
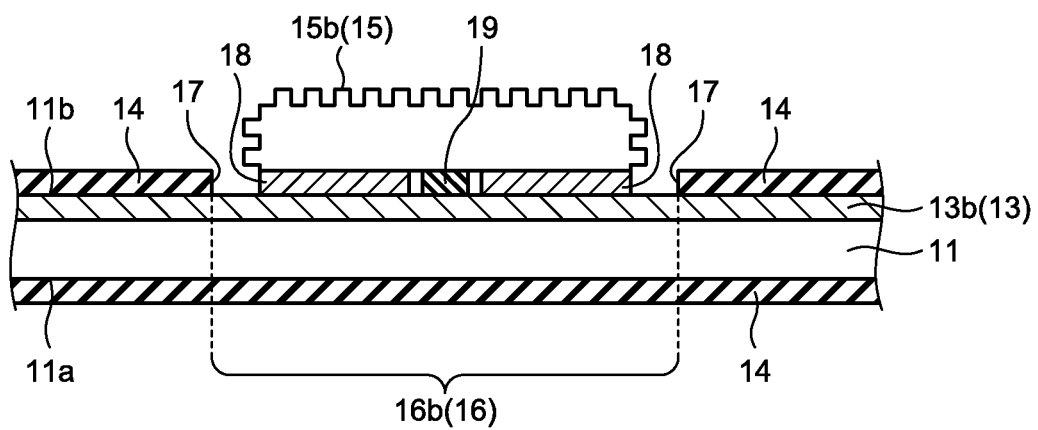
FIG. 5 is a cross-sectional view of the relevant part of the region on the printed circuit board according to the embodiment of the present invention, where the second heat-dissipating surface mount component is mounted.

First, a configuration of a printed circuit board 1 according to an embodiment of the present invention is described. FIG. 1 is a schematic plan view illustrating an overview of configuration of the printed circuit board 1 according to the embodiment of the present invention, as viewed from a side of a second main surface of the circuit board 1. In FIG. 1, illustration of a wiring pattern 13 is omitted. FIG. 2 is an enlarged plan view of a relevant part of a region on a side of a first main surface of the printed circuit board 1 according to the embodiment of the present invention, where a first heat-dissipating surface mount component 15a is mounted. FIG. 3 is a cross-sectional view taken along line III-III of FIG. 2, illustrating the relevant part of the region on the printed circuit board 1 according to the embodiment of the present invention, where the first heat-dissipating surface mount component 15a is mounted. The first main surface of the printed circuit board 1 faces an upper side of FIG. 3 while the second main surface thereof faces a lower side of FIG. 3. FIG. 4 is an enlarged plan view of a relevant part of a region on a side of the second main surface of the printed circuit board 1 according to the embodiment of the present invention, where a second heat-dissipating surface mount component 15b is mounted. FIG. 5 is a cross-sectional view taken along line V-V of FIG. 4, illustrating the relevant part of the region on the printed circuit board 1 according to the embodiment of the present invention, where the second heat-dissipating surface mount component 15b is mounted. The second main surface of the printed circuit board 1 faces an upper side of FIG. 5 while the first main surface thereof faces a lower side of FIG. 5.

The printed circuit board 1 according to the present embodiment mainly includes an insulating substrate 11, electronic components 12, the wiring patterns 13, a solder resist 14, and heat-dissipating surface mount components 15. The insulating substrate 11, the wiring patterns 13, and the solder resist 14 define a printed wiring board.

The insulating substrate 11 is a substrate formed of an insulating material such as glass epoxy. The wiring patterns 13 are arranged on a first main surface 11a of the insulating substrate 11 and a second main surface 11b of the insulating substrate 11. FIG. 1 illustrates the second main surface 11b of the insulating substrate 11.

The wiring patterns 13 are formed of metal material having a high conductivity, such as copper, and includes a first main-surface wiring pattern 13a formed on the first main surface 11a of the insulating substrate 11, and a second main-surface wiring pattern 13b formed on the second main surface 11b of the insulating substrate 11. The thickness of the wiring pattern 13 is about 30 μm to about 60 μm, for example. The first main surface 11a and the second main surface 11b of the insulating substrate 11 are entirely covered by the solder resist 14 except for a region required to expose the wiring patterns 13.

Disposed on the first main surface 11a of the insulating substrate 11 are surface mount components and manually-inserted components. The surface mount components, which are the electronic components 12 such as chip-component resistors, chip-component capacitors, and chip-component diodes, are automatically mounted on the surface by an automatic mounting machine. The manually-inserted components, which are discrete components such as large-capacity resistors, hybrid ICs, transformers, coils, large-capacity semiconductors, and large capacitors, are manually mounted in mounting holes. Further, disposed on the second main surface 11b of the insulating substrate 11 are surface mount components such as chip-component resistors, chip-component capacitors, and chip-component diodes, which are automatically mounted by an automatic mounting machine.

The heat-dissipating surface mount components 15, which are heat-dissipating components that dissipate heat of the wiring patterns 13, are surface mount components having flat bottom surfaces, that is, flat surfaces to be joined to the wiring patterns 13. The heat-dissipating surface mount components 15 are mounted via solders 18 to pad portions 16 provided on the wiring patterns 13 at positions away from the electronic components 12. That is, the bottom surfaces of the heat-dissipating surface mount components 15 are joined to the pad portions 16 via the solders 18. The pad portions 16, which are mounting regions for fixedly mounting the heat-dissipating surface mount components 15, are defined by the wiring patterns 13 exposed through openings 17 provided in the solder resist 14 in the printed circuit board 1.

The heat-dissipating surface mount components 15 include the first heat-dissipating surface mount component 15a mounted on the first main surface 11a of the insulating substrate 11 and the second heat-dissipating surface mount component 15b mounted on the second main surface 11b of the insulating substrate 11.

The first heat-dissipating surface mount component 15a is joined via the solders 18 to first pad portions 16a provided on the first main-surface wiring pattern 13a at the position away from the electronic component 12 on the first main surface 11a of the insulating substrate 11. FIG. 2 illustrates an example in which the first heat-dissipating surface mount component 15a is mounted across the two first pad portions 16a arranged along a longitudinal direction of the heat-dissipating surface mount component 15.

The second heat-dissipating surface mount component 15b is joined via the solders 18 to second pad portions 16b provided on the second main-surface wiring pattern 13b at the position away from the electronic component 12 on the second main surface 11b of the insulating substrate 11. FIG. 4 illustrates an example in which the second heat-dissipating surface mount component 15b is mounted across the two second pad portions 16b arranged along a longitudinal direction of the second heat-dissipating surface mount component 15b. Also, a portion of a bottom surface of the second heat-dissipating surface mount component 15b is joined to a surface of the solder resist 14 via an adhesive 19 in a region between the two second pad portions 16b.

The first heat-dissipating surface mount component 15a is surface-mounted on the first pad portions 16a by using the solders 18, such that the first heat-dissipating surface mount component 15a is thermally connected to the first main-surface wiring pattern 13a at the first pad portion 16a and is thermally connected via the first main-surface wiring pattern 13a to the electronic component 12 mounted on the first main surface 11a. Since the first heat-dissipating surface mount component 15a is a surface-mount type heat-dissipating component, the first heat-dissipating surface mount component 15a can be easily mounted on the first pad portions 16a by using the solders 18.

The second heat-dissipating surface mount component 15b is surface-mounted on the second pad portions 16b by using the solders 18, such that the second heat-dissipating surface mount component 15b is thermally connected to the second main-surface wiring pattern 13b at the second pad portion 16b and is thermally connected via the second main-surface wiring pattern 13b to the electronic component 12 mounted on the second main surface 11b. Since the second heat-dissipating surface mount component 15b is a surface-mount type heat-dissipating component, the second heat-dissipating surface mount component 15b can be easily mounted on the second pad portions 16b by using the solders 18.

The heat-dissipating surface mount component 15 is formed of the metal material having the high thermal conductivity, such as copper or aluminum. Thus, heat transferred from the wiring pattern 13 through the solders 18 can be efficiently dissipated into the air. From a viewpoint of mounting the heat-dissipating surface mount component 15 onto the pad portions 16 by the solders 18, it is preferable that the bottom surface of the heat-dissipating surface mount component 15 is formed of a material such as tin or zinc that provides satisfactory wettability with the solders 18.

The thickness of the heat-dissipating surface mount component 15 is the same as or thinner than that of the electronic component 12 arranged on the surface of the insulating substrate 11, for example. As a result, when the heat-dissipating surface mount component 15 is mounted on the wiring pattern 13 on the surface of the insulating substrate 11, the height of a top surface of the heat-dissipating surface mount component 15 is the same as or lower than the height of a top surface of the electronic component 12 mounted on the wiring pattern 13, so that the top surface of the heat-dissipating surface mount component 15 does not project beyond the top surface of the electronic component 12.

The heat-dissipating surface mount component 15 includes a portion not joined to the wiring pattern 13 and having an uneven surface having projections and depressions. That is, the surface of the heat-dissipating surface mount component 15 is uneven except for the bottom surface. By having this uneven surface, the heat-dissipating surface mount component 15 has a wide area of contact with the air and thus efficiently dissipates heat.

Figure 6:
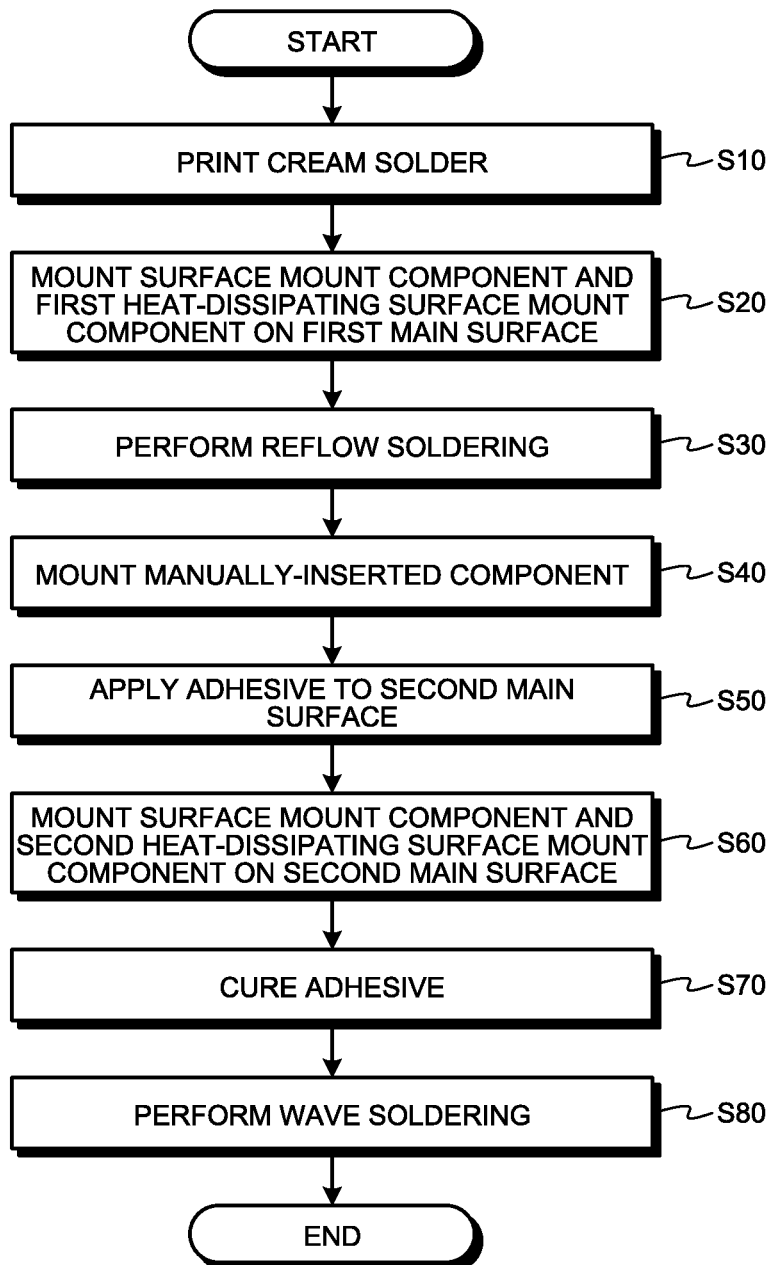
FIG. 6 is a flowchart illustrating a method for mounting a heat-dissipating surface mount component and an electronic component in manufacturing the printed circuit board according to the embodiment of the present invention.

Next, a method for mounting the heat-dissipating surface mount component 15 and the electronic component 12 in manufacturing the printed circuit board 1 is described. FIG. 6 is a flowchart illustrating a method for mounting the heat-dissipating surface mount component 15 and the electronic component 12 in manufacturing the printed circuit board 1 according to the embodiment of the present invention.

First, at Step S10, a cream solder is printed onto the first main surface 11a and the second main surface 11b of the printed wiring board that includes the insulating substrate 11, the wiring pattern 13, and the solder resist 14. The first main-surface wiring pattern 13a, the second main-surface wiring pattern 13b, the first pad portion 16a, the second pad portion 16b, the mounting pad portion for mounting the electronic component 12, and the mounting hole for mounting the electronic component are provided on the printed wiring board in advance by a wiring-pattern forming process and a pad-portion forming process. The cream solder is printed on the first pad portion 16a, the second pad portion 16b, and the mounting pad portion for mounting the electronic component 12.

Next, at Step S20, the electronic component 12 that is the surface mount component such as the chip-component resistor, the chip-component capacitor, and the chip-component diode, and the first heat-dissipating surface mount component 15a are automatically mounted on the first main surface 11a of the printed wiring board by the automatic mounting machine. The electronic component 12 is mounted on the mounting pad portion for the electronic component 12. The first heat-dissipating surface mount component 15a is mounted on the first pad portions 16a.

Next, at Step S30, the printed wiring board is put into a reflow furnace, so that the cream solder melts to thereby perform reflow soldering on the surface mount component and the first heat-dissipating surface mount component 15a on the first main surface 11a. In this manner, the surface mount component and the first heat-dissipating surface mount component 15a are fixed to the first main surface 11a of the printed wiring board. That is, at Steps S10 to S30, an electronic-component mounting process of mounting the electronic component 12 and a heat-dissipating-component mounting process of mounting the first heat-dissipating surface mount component 15a are performed.

Next, at Step S40, the manually-inserted component, which is the discrete component such as the discrete resistor, the discrete capacitor, and the discrete diode, is manually inserted and mounted in the mounting hole for the electronic component 12 provided on the printed wiring board on the first main surface 11a of the printed wiring board.

Next, at Step S50, adhesives for provisionally fixing the surface mount components are applied onto the second main surface 11b of the printed wiring board. The adhesives 19 are printed at a position where the electronic component 12 can be provisionally fixed onto the mounting pad portion for the electronic component 12 and a position where the second heat-dissipating surface mount component 15b can be provisionally fixed onto the second pad portion 16b.

Next, at Step S60, the electronic component 12 that is the surface mount component such as the chip-component resistor, the chip-component capacitor, and the chip-component diode, and the second heat-dissipating surface mount component 15b are automatically mounted on the adhesives 19 applied on the second main surface 11b of the printed wiring board by the automatic mounting machine. The electronic component 12 is mounted at the position across the adhesive 19 and the mounting pad portion for the electronic component 12. The second heat-dissipating surface mount component 15b is mounted at the position across the adhesive 19 and the second pad portions 16b.

Next, at Step S70, the printed wiring board is put into an adhesive curing furnace, so that the adhesives 19 applied on the second main surface 11b of the printed wiring board are heated and thus cured. In this manner, the electronic component 12 and the second heat-dissipating surface mount component 15b, which are mounted on the adhesives 19 applied on the second main surface 11b, are provisionally fixed to the second main surface 11b of the printed wiring board by the adhesives 19.

Next, at Step S80, soldering of the surface mount component mounted on the second main surface 11b of the printed wiring board, the second heat-dissipating surface mount component 15b, and the manually-inserted component inserted and mounted in the mounting hole of the printed wiring board is performed by flow soldering that uses a wave soldering device. As for the second heat-dissipating surface mount component 15b, the exposed second main-surface wiring pattern 13b at the second pad portions 16b and the bottom surface of the second heat-dissipating surface mount component 15b are soldered to each other via the solders 18. In this case, the entire bottom surface of the heat-dissipating surface mount component 15 may be joined to the second main-surface wiring pattern 13b via the solders 18 and the adhesive 19. In this manner, the electronic component 12, the second heat-dissipating surface mount component 15b, and the manually-inserted component are fixed to the second main surface 11b of the printed wiring board. That is, at Steps S40 to S80, the electronic-component mounting process of mounting the electronic component 12 and the heat-dissipating-component mounting process of mounting the second heat-dissipating surface mount component 15b are performed. With the above step, work of mounting the heat-dissipating surface mount component 15 and the electronic component 12 is completed.

In the printed circuit board 1 described above, when a current flows through the electronic component 12 and the first main-surface wiring pattern 13a mounted on the first main surface 11a, the electronic component 12 generates heat. The heat generated from the electronic component 12 is conducted through the first main-surface wiring pattern 13a, the solder 18, and the first heat-dissipating surface mount component 15a in this order and is then dissipated from the first heat-dissipating surface mount component 15a. Further, because the thickness of the first main-surface wiring pattern 13a is as thin as about 30 μm to about 60 μm, the first main-surface wiring pattern 13a generates heat and then is heated because of the resistance thereof, when a current flows through the first main-surface wiring pattern 13a. The heat generated from the first main-surface wiring pattern 13a is conducted through the solders 18 and the first heat-dissipating surface mount component 15a in this order and is then dissipated from the first heat-dissipating surface mount component 15a. In addition, heat conducted from the electronic component 12 to the first main-surface wiring pattern 13a and heat generated from the first main-surface wiring pattern 13a are partially dissipated from the first main-surface wiring pattern 13a at the pad portions 16 exposed through the opening 17 and having no first heat-dissipating surface mount component 15a mounted thereon.

Also, in the printed circuit board 1 described above, when a current flows through the electronic component 12 and the second main-surface wiring pattern 13b mounted on the second main surface 11b, the electronic component 12 generates heat. The heat generated from the electronic component 12 is conducted through the second main-surface wiring pattern 13b, the solder 18, and the second heat-dissipating surface mount component 15b in this order and is then dissipated from the second heat-dissipating surface mount component 15b. Further, because the thickness of the second main-surface wiring pattern 13b is as thin as about 30 μm to about 60 μm, the second main-surface wiring pattern 13b generates heat and then is heated because of the resistance thereof, when a current flows through the second main-surface wiring pattern 13b. The heat generated from the second main-surface wiring pattern 13b is conducted through the solders 18 and the second heat-dissipating surface mount component 15b in this order and is then dissipated from the second heat-dissipating surface mount component 15b. In addition, heat conducted from the electronic component 12 to the second main-surface wiring pattern 13b and heat generated from the second main-surface wiring pattern 13b are partially dissipated from the second main-surface wiring pattern 13b at the pad portions 16 exposed through the opening 17 and having no second heat-dissipating surface mount component 15b mounted thereon.

Therefore, the printed circuit board 1 can efficiently dissipate heat of the wiring pattern 13 from both surfaces of the first main surface 11a and the second main surface 11b, thereby preventing the wiring pattern 13 from being excessively heated. In this manner, it is possible to prevent heat of the wiring pattern 13 from doing damage to the wiring pattern 13 and deteriorating coolability of other electronic components mounted on the wiring pattern 13.

Although the foregoing description is made as to a case where the second heat-dissipating surface mount component 15b is fixed to the second pad portion 16b via the solders 18 and the adhesive 19, the second heat-dissipating surface mount component 15b may be fixed on the second main surface 11b by the adhesive 19 only.

Figure 7:
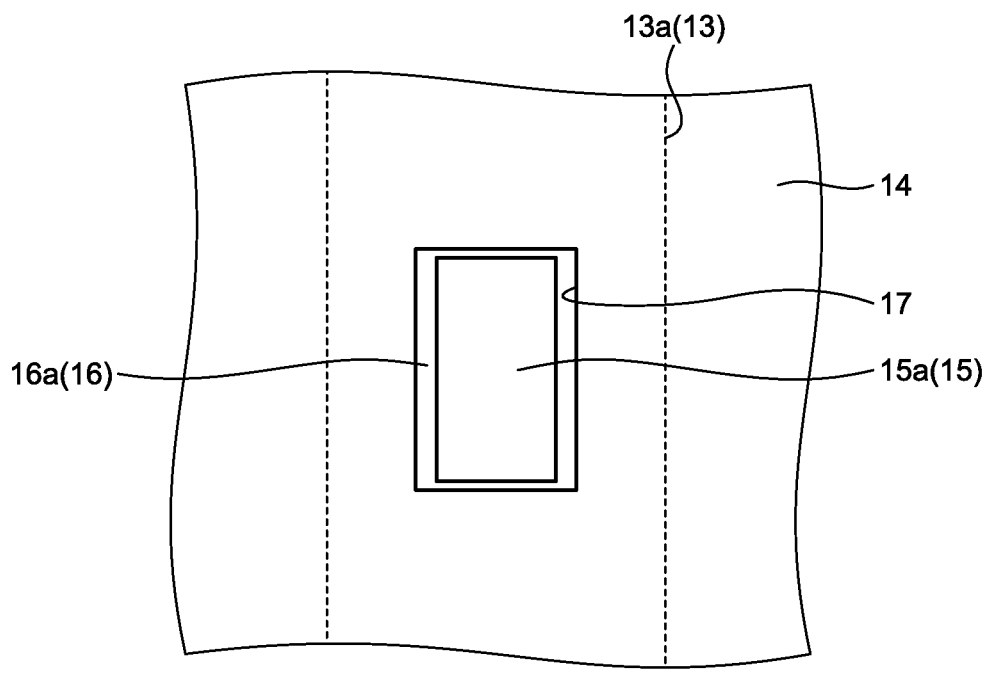
FIG. 7 is an enlarged plan view of a relevant part of a region on the first main surface of the printed circuit board according to the embodiment of the present invention, where the entire bottom surface of the first heat-dissipating surface mount component is joined to a wiring pattern via a solder.

FIG. 7 is an enlarged plan view of a relevant part of a region on the first main surface 11a of the printed circuit board 1 according to the embodiment of the present invention, where the entire bottom surface of the first heat-dissipating surface mount component 15a is joined to the wiring pattern 13 via the solder 18. Although the foregoing description is made as to an example in which the heat-dissipating surface mount component 15 is mounted across the two pad portions 16 arranged along the longitudinal direction of the heat-dissipating surface mount component 15, the entire bottom surface of the first heat-dissipating surface mount component 15a may be mounted on a wide-area portion of the first main-surface wiring pattern 13a via the solder 18, as illustrated in FIG. 7. Due to this configuration, an area where the first main-surface wiring pattern 13a and the first heat-dissipating surface mount component 15a are joined to each other via the solder 18 can be increased to thereby further increase a heat-dissipating effect in the first heat-dissipating surface mount component 15a.

Figure 8:
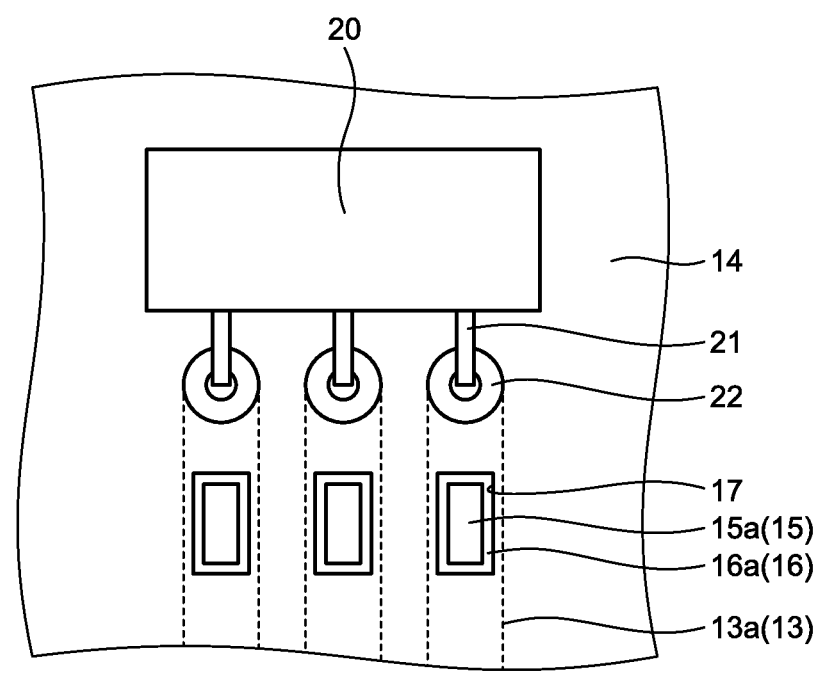
FIG. 8 is an enlarged plan view of a relevant part of a region on the first main surface of the printed circuit board according to the embodiment of the present invention, where the first heat-dissipating surface mount components are mounted on a first main-surface wiring pattern to which electrodes of a large-current electronic component are connected.

FIG. 8 is an enlarged plan view of a relevant part of a region on the first main surface 11a of the printed circuit board 1 according to the embodiment of the present invention, where the first heat-dissipating surface mount components 15a are mounted on the first main-surface wiring patterns 13a to which electrodes 21 of a large-current electronic component 20 are connected. In a case where the large-current electronic component 20 having the plural electrodes 21 disposed at intervals that are small but required to have insulation distances for a high voltage is mounted on the printed circuit board 1, the first pad portion 16a is formed in each first main-surface wiring pattern 13a on which a pad portion 22 connected to the electrode 21 of the large-current electronic component 20 is provided, as illustrated in FIG. 8. The first heat-dissipating surface mount component 15a is mounted on this first pad portion 16a. Due to this configuration, the printed circuit board 1 can increase an effect of dissipating heat from the large-current electronic component 20 and the first heat-dissipating surface mount component 15a even in a case where heat dissipation from the first main-surface wiring pattern 13a is inefficient because of the small intervals between the plural electrodes 21, and more heat is generated in the first main-surface wiring pattern 13a and heat dissipation from the first main-surface wiring pattern 13a is inefficient because of the small width of the first main-surface wiring pattern 13a connected to each electrode 21. Therefore, the printed circuit board 1 can increase an allowable amount of current flowing through the first heat-dissipating surface mount component 15a, so that an allowable current of the small-pitch-component-mounted circuit can be increased.

As described above, in the printed circuit board 1 according to the present embodiment, the heat-dissipating surface mount components 15 are mounted on the pad portions 16 provided on the wiring patterns 13. Therefore, an effect of efficiently dissipating heat generated from current circuits of the printed circuit board 1, that is, the electronic component 12, the large-current electronic component 20, and the wiring pattern 13 can be obtained. Such an effect is large particularly in a case where more current flows through the current circuit. Therefore, it is possible to increase an allowable amount of current flowing through the wiring pattern 13.

The heat-dissipating surface mount component 15 is the surface mount component. The first heat-dissipating surface mount component 15a is automatically mounted to and soldered by reflow soldering to the side of the first main surface of the printed circuit board 1 after the cream solder is applied onto the first main surface of the printed wiring board while the second heat-dissipating surface mount component 15b of the printed wiring board is automatically mounted to and provisionally fixed by the adhesive 19 to the side of the second main surface of the printed circuit board 1, after which the second heat-dissipating surface mount component 15b is soldered by flow soldering. Therefore, it is possible to automatically mount the heat-dissipating surface mount component 15 efficiently at a high speed, and mount the heat-dissipating surface mount component 15 easily and inexpensively.

In addition, the joint area between the wiring pattern 13 and the heat-dissipating surface mount component 15 is increased because the heat-dissipating surface mount component 15 is mounted on the wiring pattern with the entire bottom surface of the heat-dissipating surface mount component 15 contacting the wide-area portion of the wiring pattern 13. This increase in the joint area provides an effect of further increasing dissipation of heat generated from the current circuit.

Furthermore, since the heat-dissipating surface mount component 15 has the uneven surface at the portion thereof not joined to the wiring pattern 13, the heat-dissipating surface mount component 15 has the wide area of contact with the air, thereby increasing a heat-dissipating effect of the heat-dissipating surface mount component 15.

Therefore, according to the printed circuit board 1 of the present embodiment, the simple structure makes it possible to inexpensively achieve heat dissipation of the wiring pattern 13.

Figure 9:
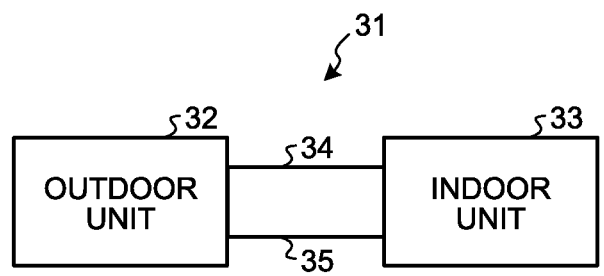
FIG. 9 is a schematic diagram illustrating a configuration of an air conditioner in which the printed circuit board according to the embodiment of the present invention is provided.
Figure 10:
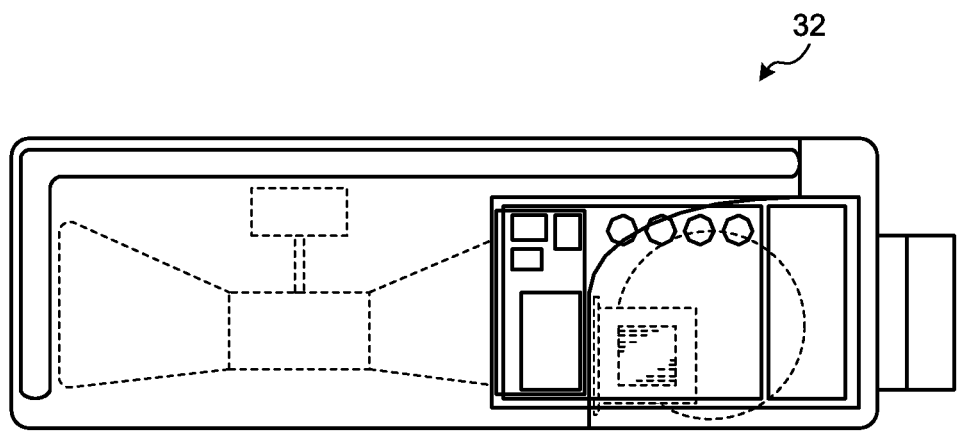
FIG. 10 is a schematic top view illustrating an example of an outdoor unit of the air conditioner in which the printed circuit board according to the embodiment of the present invention is provided.
Figure 11:
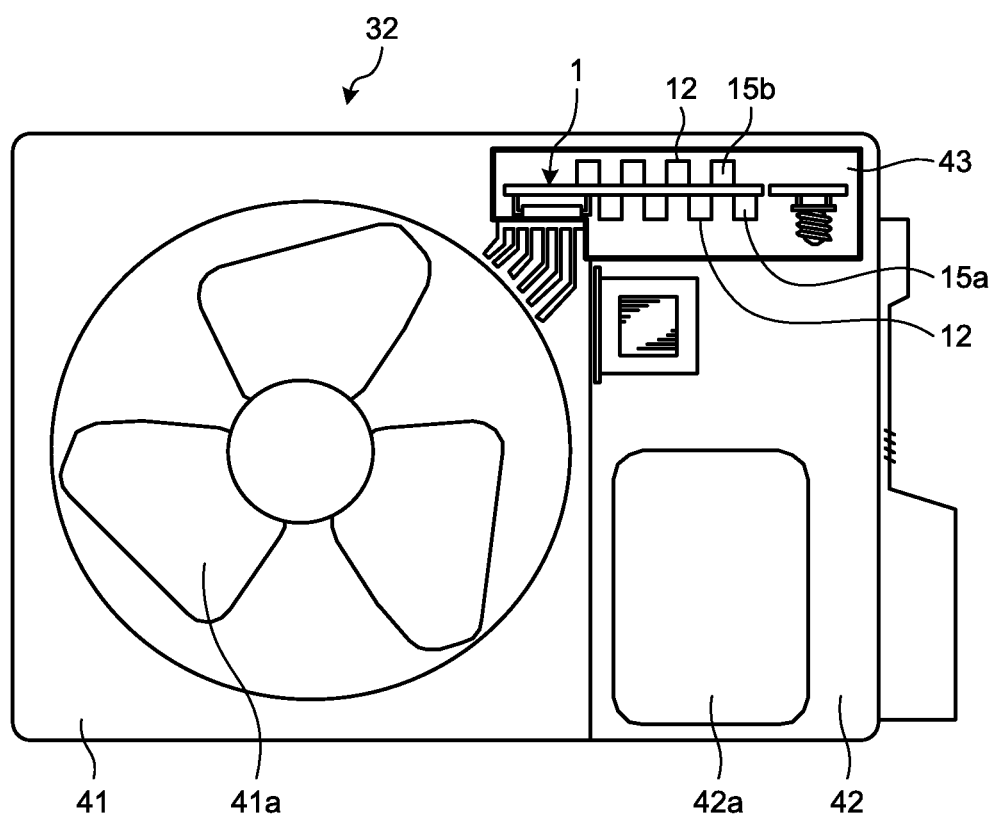
FIG. 11 is a schematic front view illustrating the outdoor unit of the air conditioner in which the printed circuit board according to the embodiment of the present invention is provided.

Next, an example of use of the printed circuit board 1 described above is described. FIG. 9 is a schematic diagram illustrating a configuration of an air conditioner 31 in which the printed circuit board 1 according to the embodiment of the present invention is provided. FIG. 10 is a schematic top view illustrating an example of an outdoor unit of the air conditioner in which the printed circuit board 1 according to the embodiment of the present invention is provided. FIG. 11 is a schematic front view illustrating the outdoor unit of the air conditioner in which the printed circuit board 1 according to the embodiment of the present invention is provided.

The air conditioner 31 according to the present embodiment includes an outdoor unit 32 arranged outdoor and an indoor unit 33 arranged indoor. The outdoor unit 32 and the indoor unit 33 are connected to each other by a refrigerant pipe 34 and an indoor-outdoor communication line 35. A refrigerant for performing heat exchange flows through the refrigerant pipe 34. In the air conditioner 31, one complete refrigerating cycle is established by the outdoor unit 32 and the indoor unit 33. The air conditioner 31 effects heat transfer between indoor-air of a room that is to be air-conditioned and outdoor-air by using the refrigerant that flows through the refrigerant pipe 34 and circulates between the outdoor unit 32 and the indoor unit 33, thereby achieving the air conditioning indoor. FIG. 10 and FIG. 11 illustrate only configurations of relevant parts related to characteristics of the outdoor unit 32.

The outdoor unit 32 of the air conditioner 31 is configured by a blower chamber 41 provided with a blower 41a and a compressor chamber 42 provided with a compressor 42a and an electric component box 43 having a flat shape. The electric component box 43 has incorporated therein the printed circuit board 1 having the above-described heat-dissipating surface mount components 15 mounted thereon with the first main surface 11a facing downwardly and the second main surface 11b facing upwardly.

The air conditioner according to the present embodiment, which incorporates therein the printed circuit board 1 having the heat-dissipating surface mount components 15 mounted thereon, provides the improved heat-dissipating effect of the printed circuit board 1 to thereby prevent the damage to the printed circuit board 1 and the deterioration of coolability of the printed circuit board 1, so that an effect of improving the quality of the air conditioner can be obtained.

The configurations described in the above embodiment are only examples of the content of the present invention. The respective configurations in the embodiment can be combined with each other or with other well-known techniques, and a part of each configuration can be omitted or modified without departing from the scope of the present invention.

The invention claimed is:

1. A printed circuit board comprising:
   an insulating substrate having a plurality of wiring patterns on a main surface of the insulating substrate;
   an electronic component mounted on the main surface of the insulating substrate, the electronic component having a plurality of electrodes required to have insulation distances therebetween, the plurality of electrodes of the electronic component being connected one-to-one to the plurality of wiring patterns; and
   a heat-dissipating surface mount component that is a surface mount component mounted to the main surface of the insulating substrate, the heat-dissipating surface mount component being joined via a solder to one of the wiring patterns on the main surface of the insulating substrate to dissipate heat of the wiring pattern, the heat-dissipating surface mount component has a bottom surface entirely joined to only one of the wiring patterns.

2. The printed circuit board according to claim 1, wherein the bottom surface of the heat-dissipating surface mount component is joined to the wiring pattern via the solder and an adhesive.

3. The printed circuit board according to claim 1, wherein the heat-dissipating surface mount component has a portion not joined to the wiring pattern, the portion of the heat-dissipating surface mount component having an uneven surface.

4. An air conditioner comprising an indoor unit and an outdoor unit, wherein an electric component box having accommodated therein the printed circuit board according to claim 1 is disposed in a compressor chamber of the outdoor unit.

5. A method for manufacturing a printed circuit board, the method comprising:
- a pad-portion forming step of forming a pad portion on each of a plurality of wiring patterns of a printed wiring board, the wiring patterns being provided on a main surface of an insulating substrate of the printed wiring board;
- an electronic-component mounting step of mounting an electronic component on the wiring pattern such that the plurality of electrodes of the electronic component are connected one-to-one to the plurality of wiring patterns; and
- a heat-dissipating component mounting step of joining a heat-dissipating surface mount component to the pad portion via a solder, the heat-dissipating surface mount component being a surface mount component to dissipate heat of the wiring pattern, wherein
- the electronic component is an electronic component having a plurality of electrodes required to have insulation distances therebetween, and
- in the heat-dissipating component mounting step, the heat-dissipating surface mount component is mounted on one of the wiring patterns such that an entire bottom surface of the heat-dissipating surface mount component is joined to only one of the wiring patterns.

6. The method for manufacturing the printed circuit board according to claim 5, wherein the heat-dissipating surface mount component is joined to the pad portion by reflow soldering.

7. The method for manufacturing the printed circuit board according to claim 5, wherein the heat-dissipating surface mount component is joined to the pad portion by flow soldering after the heat-dissipating surface mount component is provisionally fixed to the pad portion by an adhesive.

8. The method for manufacturing the printed circuit board according to claim 5, wherein the heat-dissipating surface mount component has a portion not joined to the wiring pattern, the portion of the heat-dissipating surface mount component having an uneven surface.

* * * * *